(12) United States Patent
Nishimura

(10) Patent No.: US 7,248,115 B2
(45) Date of Patent: Jul. 24, 2007

(54) DIFFERENTIAL AMPLIFIER OPERABLE IN WIDE RANGE

(75) Inventor: Kouichi Nishimura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/801,004

(22) Filed: Mar. 16, 2004

(65) Prior Publication Data

US 2004/0189386 A1 Sep. 30, 2004

(30) Foreign Application Priority Data

Mar. 27, 2003 (JP) ............................... 2003-087312

(51) Int. Cl.
*H03F 3/45* (2006.01)
(52) U.S. Cl. ...................... 330/253; 330/257; 330/261; 330/269
(58) Field of Classification Search ................ 330/253, 330/257, 261, 269
See application file for complete search history.

(56) References Cited

U.S. PATENT DOCUMENTS

| 5,953,276 | A | * | 9/1999 | Baker .......................... 365/208 |
| 6,052,025 | A | * | 4/2000 | Chang et al. ................. 330/253 |
| 6,169,454 | B1 | * | 1/2001 | Hogeboom ................... 330/258 |
| 6,194,962 | B1 | | 2/2001 | Chen |
| 6,236,269 | B1 | * | 5/2001 | Hojabri ....................... 330/253 |

FOREIGN PATENT DOCUMENTS

| JP | 60-217709 | 10/1985 |
| JP | 64-54813 | 3/1989 |
| JP | 3-62712 | 3/1991 |
| JP | 5-29840 | 2/1993 |
| JP | 6-85570 | 3/1994 |
| JP | 6-260845 | 9/1994 |
| JP | 7-273558 | 10/1995 |
| JP | 2002-344264 | 11/2002 |

* cited by examiner

*Primary Examiner*—Patricia Nguyen
(74) *Attorney, Agent, or Firm*—Young & Thompson

(57) ABSTRACT

Differential amplifier includes a differential amplifier circuit, a bias circuit and an output circuit. The differential amplifier circuit includes first and second differential amplifier sections. The first differential amplifier section includes a first PMOS transistor which has a source connected with a power supply line, and a first pair of PMOS transistors which have sources connected with a drain of the first PMOS and gates respectively receiving first and second input voltages. The second differential amplifier section includes a first NMOS transistor which has a source connected with a ground line, and a second pair of NMOS transistors which have sources connected with a drain of the first NMOS and gates respectively receiving the first and second input voltages. The bias circuit activates one of the amplifier sections in response to a control signal. The output circuit outputs an output signal from an output of the activated differential amplifier section.

23 Claims, 9 Drawing Sheets

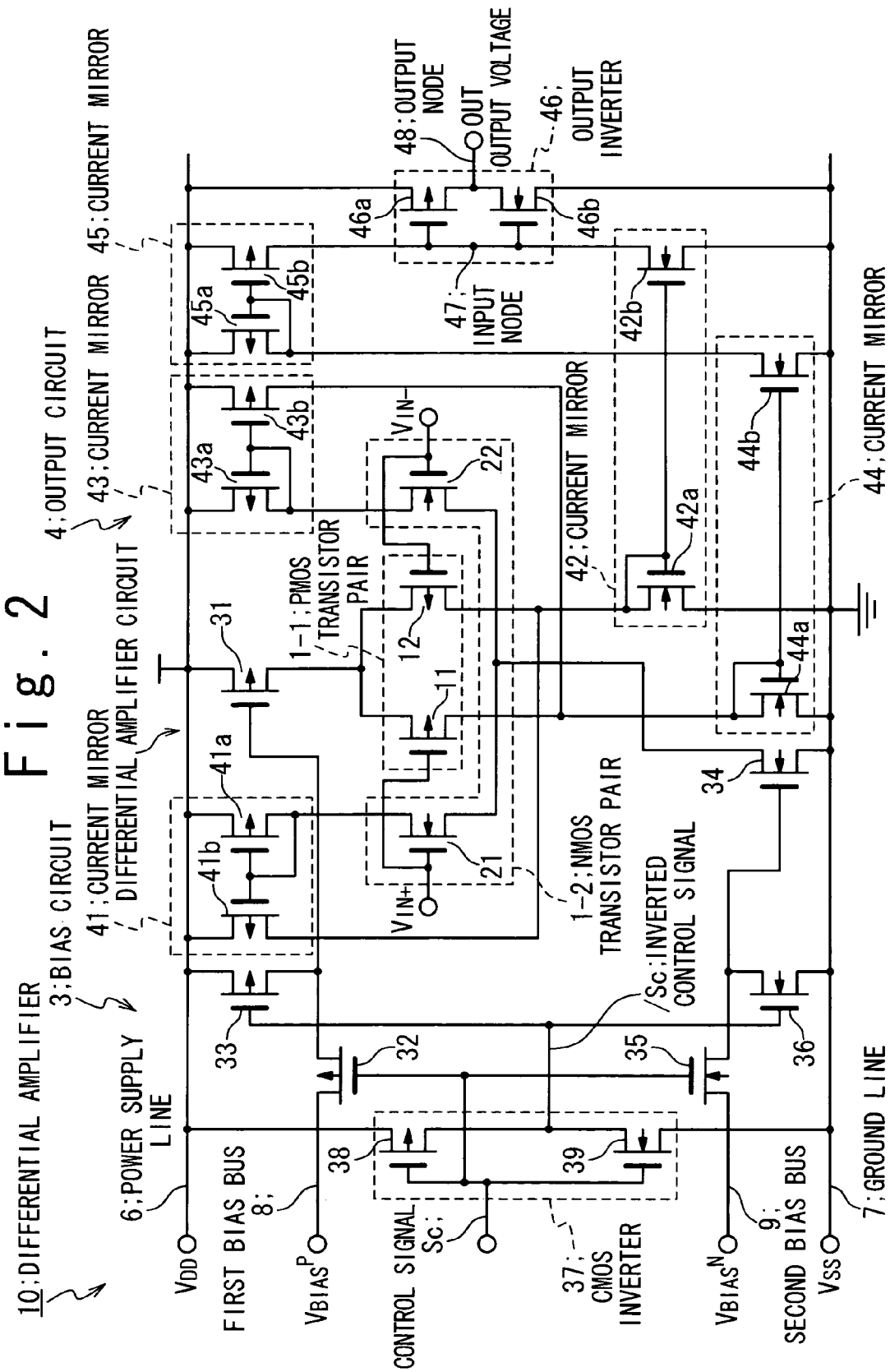

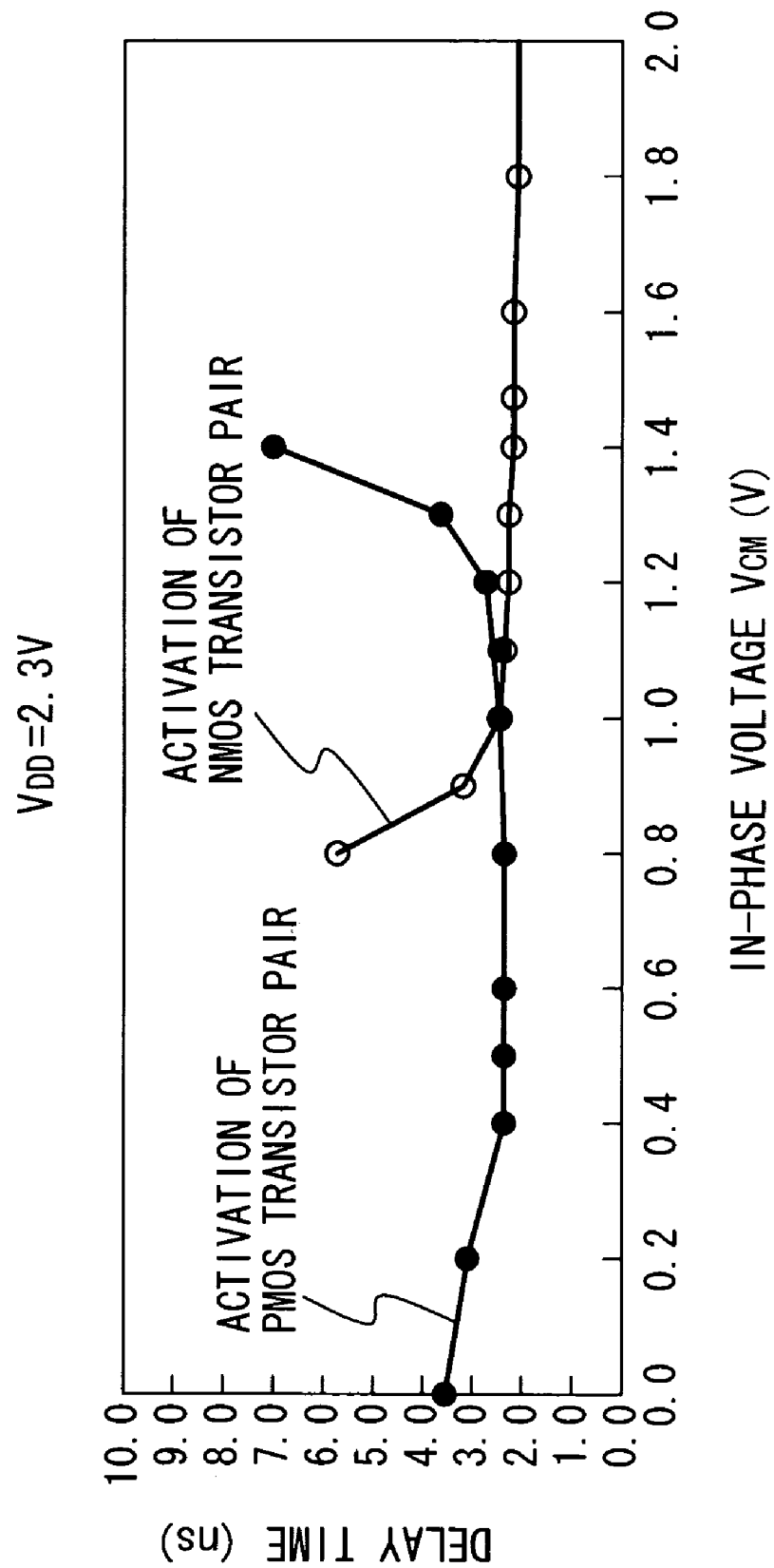

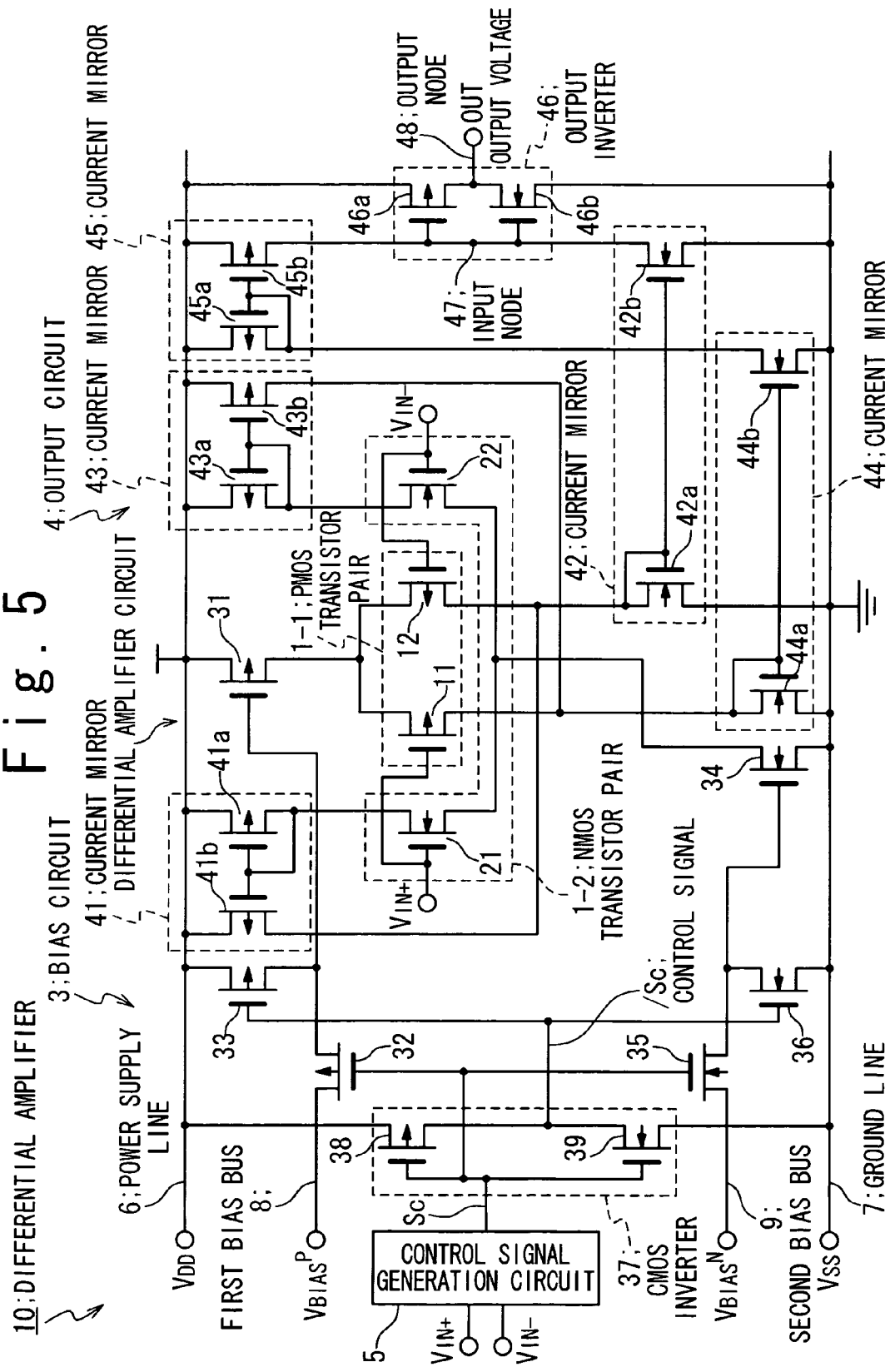

US 7,248,115 B2

DIFFERENTIAL AMPLIFIER OPERABLE IN WIDE RANGE

BACKGROUND OF THE INVENTION

1. Field of the Invention

The present invention relates to a differential amplifier.

2. Description of the Related Art

A differential amplifier outputs an output signal corresponding to a potential difference between two input signals and is widely used in integrated circuits.

A differential amplifier 100 installed in LSI (Large Scale Integrated circuit) is typically composed of a pair of PMOS transistors 101 and 102 whose sources are coupled to a common node and a PMOS transistor 103 inserted between the common node and a power supply terminal 104 having a power supply voltage $V_{DD}$, as shown in FIG. 1. Input voltages $V_{IN+}$ and $V_{IN-}$ are supplied to gates of the PMOS transistors 101 and 102, respectively. A constant bias voltage is applied to the gate of the PMOS transistor 103. The PMOS transistor 103 functions as a constant current source to send a constant bias current $I_{BIAS}$ to the sources of the PMOS transistors 101 and 102.

If the input voltage $V_{IN+}$ is lower than the input voltage $V_{IN-}$, the whole of the bias current $I_{BIAS}$ flows through the PMOS transistor 101, and is taken out as an output current $I_{OUT+}$. On the other hand, if the input voltage $V_{IN+}$ is higher than the input voltage $V_{IN-}$, the whole of the bias current $I_{BIAS}$ flows through the PMOS transistor 102, and is taken out as an output current $I_{OUT-}$. When the output currents $I_{OUT+}$ and $I_{OUT-}$ flow into loads, an output of the differential amplifier 100 can be taken out also as a voltage. It should be noted that the differential amplifier can be formed of not PMOS transistors but NMOS transistors.

In order to normally operate such a differential amplifier, the two input voltages supplied to the differential amplifier need to be limited to a certain range. That is, it is not allowable that the two input voltages extend to the entire range between a ground voltage $V_{SS}$ and the power supply voltage $V_{DD}$. For example, the two input voltages $V_{IN+}$ and $V_{IN-}$ of the differential amplifier 100 shown in FIG. 1 need to be higher than the ground voltage $V_{SS}$ and lower than the voltage $V_{DD}-(V_{GS}+V_{DS(SAT)})$. Here, the $V_{DS(SAT)}$ is the voltage between the drain and source of the PMOS transistor 103 when the PMOS transistor 103 is used in a saturation region. The $V_{GS}$ is the voltage between the gate and source of the PMOS transistor 101 (or the PMOS transistor 102) when the bias current $I_{BIAS}$ flows through the PMOS transistor 101 (or the PMOS transistor 102). Similarly, when the differential amplifier is formed of NMOS transistors, the input voltages $V_{IN+}$ and $V_{IN-}$ need to be higher than the $V_{SS}+(V_{GS}+V_{DS(SAT)})$ and lower than the power supply voltage $V_{DD}$. The limit on the input voltage of the differential amplifier reduces the free degree of the design of the differential amplifier, and is not desired.

A CMOS operation amplifier circuit is described in Japanese Laid open Patent application (JP-A-Heisei 3-62712). In this conventional example, an allowable range for the input voltage of the differential amplifier is extended. The differential amplifier is composed of a pair of P-channel transistors for receiving input signals, a pair of N-channel transistors for receiving the input signals, and a circuit for synthesizing the outputs of the transistor pairs. The P-channel transistor pair and the N-channel transistor pair are different in the allowable range for the input voltage. Thus, the differential amplifier can be operated if the two input voltages are within the voltage range in which at least one of the P-channel transistor pair and the N-channel transistor pair can be operated.

In the differential amplifier, it is also desired that the power consumption is small in addition to the wide allowable range for the two input voltages. Since a large number of differential amplifiers are used in the LSI, it is extremely effective for the reduction in the power consumption of the LSI that the power consumption is small.

SUMMARY OF THE INVENTION

Therefore, it is an object of the present invention to provide a differential amplifier in which an allowable range for an input voltage is widened. Another object of the present invention to provide a differential amplifier in which the power consumption is small.

In an aspect of the present invention, a differential amplifier includes a differential amplifier circuit, a bias circuit and an output circuit. The differential amplifier circuit includes first and second differential amplifier sections. The first differential amplifier section includes a first PMOS transistor which has a source connected with a power supply line, and a first pair of PMOS transistors which have sources connected with a drain of the first PMOS and gates respectively receiving first and second input voltages. The second differential amplifier section includes a first NMOS transistor which has a source connected with a ground line, and a second pair of NMOS transistors which have sources connected with a drain of the first NMOS and gates respectively receiving the first and second input voltages. The bias circuit activates one of the first and second differential amplifier sections in response to a control signal. The output circuit outputs an output signal from an output of the activated differential amplifier section.

Here, the first PMOS transistor and the first NMOS transistor function as constant current sources. The bias circuit stops an operation of the first PMOS transistor when activating the second differential amplifier section, and stops an operation of the first NMOS transistor when activating the first differential amplifier section.

Also, the bias circuit may include a first switch arranged to connect a first bias voltage to a gate of the first PMOS transistor in response to the control signal; and a second switch arranged to connect a second bias voltage to a gate of the first NMOS transistor in response to the control signal. When one of the first and second switches is turned on, the other is turned off. In this case, the bias circuit may include an inverter which inverts the control signal; a third switch which is connected between the power supply line and a gate of the first PMOS transistor and switches in response to the inverted control signal; and a fourth switch which is connected between the ground line and a gate of the first NMOS transistor and switches in response to the inverted control signal. Thus, when one of the third and fourth switches is turned on, the other is turned off. In this case, when the first switch is turned on, the third switch is turned off, and when the second switch is turned on, the fourth switch is turned off.

Also, the first differential amplifier section may include a first current mirror circuit which is connected between a drain of each of the PMOS transistors of the first pair and the ground line. Also, the second differential amplifier section may include a second current mirror circuit which is connected between a drain of each of the NMOS transistors of the second pair and the power supply line. In this case, the first current mirror may include second NMOS transistors, and the second current mirror may include second PMOS transistors. Sources of the second NMOS transistors are connected with the ground line, and gates of the second NMOS transistors are connected with each other. Also, a drain of one of the second NMOS transistors is connected with a drain of a corresponding one of the PMOS transistors of the first pair. Also, sources of the second PMOS transistors are connected with the power supply line, and gates of the second PMOS transistors are connected with each other. Also, a drain of one of the second PMOS transistors is connected with a drain of a corresponding one of the NMOS transistors of the second pair. Also, a drain of the other of the second PMOS transistors is connected with the first current mirror which is connected with one of the PMOS transistors of the first pair which PMOS transistor is supplied with one of the first and second input voltages, and the one of the second PMOS transistors is connected with one of the NMOS transistors of the second pair which NMOS transistor is supplied with the other of the first and second input voltages.

At this time, the output circuit obtains the output of the activated differential amplifier section from the second NMOS transistors of the first current mirrors which second NMOS transistors are not connected with the PMOS transistors of the first pair.

Also, the differential amplifier may further include a control signal generating circuit which generates the control signal based on the first and second input voltages. In this case, the control signal generating circuit may include a first circuit which generates an average voltage of the first and second input voltages; and a second circuit which generates the control signal from the average voltage.

The first circuit may include a second constant current source connected with the ground line; third NMOS transistors which are connected with the second constant current source and receives the first and second input voltages at gates of the third NMOS transistors; fourth NMOS transistors which are connected with the second constant current source; and a current mirror which is connected with the power supply line and supplies the fourth NMOS transistor with a current equal to a sum of currents flowing through the third NMOS transistors, and the average voltage is outputted from a node between the current mirror and the fourth NMOS transistors. In this case, the second circuit may include a comparator which compares a predetermined reference voltage and the average voltage to output the control signal.

Also, the control signal generating circuit may further include a filter circuit which is provided between the first and second circuits. Alternately, the first circuit further may include a buffer which is connected between the node and the second circuit.

In another aspect of the present invention, a method of outputting an output signal from first and second input voltages is applied to an differential amplifier circuit may include first and second differential amplifier sections. The first differential amplifier section may include a first PMOS transistor which has a source connected with a power supply line, and a first pair of PMOS transistors which have sources connected with a drain of the first PMOS and gates respectively receiving first and second input voltages. Also, the second differential amplifier section may include a first NMOS transistor which has a source connected with a ground line, and a second pair of NMOS transistors which have sources connected with a drain of the first NMOS and gates respectively receiving the first and second input voltages. The method is achieved by activating one of the first and second differential amplifier sections in response to a control signal; by supplying first and second input voltages to the activated differential amplifier section; and by outputting an output signal from an output of the activated differential amplifier section.

Here, the activating may be achieved by (a) controlling the first PMOS transistor to be tuned on and the first NMOS transistor turned off when the first differential amplifier section is activated in response to the control signal; and by (b) controlling the first NMOS transistor to be turned on and the first PMOS transistor to be turned off when the second differential amplifier section is activated in response to the control signal.

Also, the (a) controlling may be achieved by supplying a first bias voltage to a gate of the first PMOS transistor; and by stopping the supply of the first bias voltage to the gate of the first PMOS transistor. Also, the (b) controlling may be achieved by supplying a second bias voltage to a gate of the first NMOS transistor; and by stopping the supply of the second bias voltage to the gate of the first NMOS transistor.

Also, the activating may be achieved by inverting the control signal; by connecting a gate of the first NMOS transistor to the ground line in response to the inverted control signal, when the first differential amplifier section is activated in response to the control signal; and by connecting a gate of the first PMOS transistor to the power supply line in response to the inverted control signal, when the second differential amplifier section is activated in response to the control signal.

Also, the method may include generating the control signal based on the first and second input voltages.

BRIEF DESCRIPTION OF THE DRAWINGS

FIG. 2 is a circuit diagram showing the circuit structure of a differential amplifier according to a first embodiment of the present invention;

FIG. 4 is a graph showing an operation range of the differential amplifier in the first embodiment;

FIG. 5 is a circuit diagram showing the circuit structure of the differential amplifier according to a second embodiment of the present invention;

DESCRIPTION OF THE PREFERRED EMBODIMENTS

Hereinafter, a differential amplifier of the present invention will be described in detail with reference to the attached drawings.

(First Embodiment)

Figure 1:
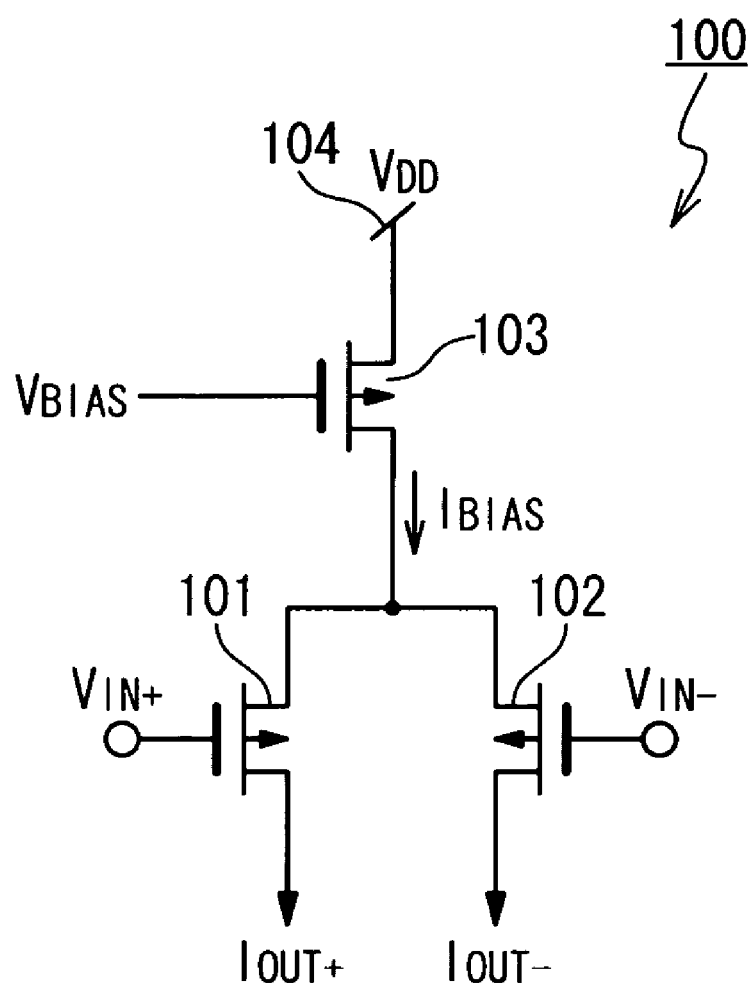
FIG. 1 is a circuit diagram showing the circuit structure of a conventional differential amplifier.
Figures 3A, 3B, 3C:
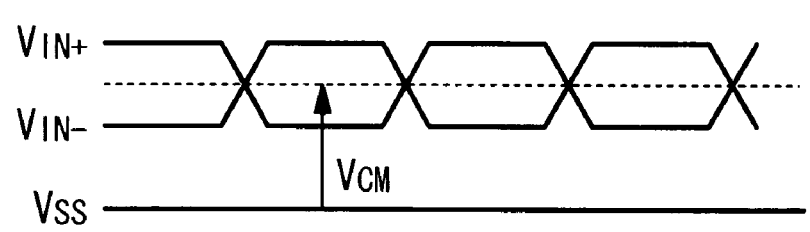
FIGS. 3A to 3C are timing charts showing waveforms of an input voltages $V_{IN+}$ and an inverted input voltage $V_{IN-}$.

FIG. 2 shows the differential amplifier according to the first embodiment of the present invention. The differential amplifier 10 in the first embodiment compares an input voltage $V_{IN+}$ and an inverted input voltage $V_{IN-}$ and generates an output voltage OUT. As shown in FIGS. 3A to 3C, the input voltage $V_{IN+}$ and the inverted input voltage $V_{IN-}$ are a set of voltages that varies at small amplitudes with respect to a common mode voltage $V_{CM}$ as a center. The amplitudes of the input voltage $V_{IN+}$ and the inverted input voltage $V_{IN-}$ are typically 100 to 400 mV. The input voltage $V_{IN+}$ and the inverted input voltage $V_{IN-}$ are generated such that its average is coincident with the common mode voltage $V_{CM}$.

As shown in FIG. 2, the differential amplifier 10 is composed of a bias circuit 3, a differential amplifier circuit 1, and an output circuit 4.

The differential amplifier circuit 1 is composed of a PMOS transistor 31, a pair 1-1 of PMOS transistors 11 and 12, a pair 1-2 of NMOS transistor pair 21 and 22, NMOS transistors 34, 44a and 42a, and current mirrors 41 and 43. The source of the PMOS transistor 31 is connected with a power supply line 6 which is connected with a power supply voltage. The sources of the PMOS transistor 11 and 12 are coupled to the drain of the PMOS transistor 31. An input voltage $V_{IN+}$ is supplied to the gate of the PMOS transistor 11, and an inverted input voltage $V_{IN-}$ is supplied to the gate of the PMOS transistor 12. Any one of the PMOS transistor 11 and the PMOS transistor 12 is turned on in response to the input voltage $V_{IN+}$ and the inverted input voltage $V_{IN-}$. The drain of the PMOS transistor 11 is connected with the source and gate of the NMOS transistor 44a. The drain of the NMOS transistor 44a is connected with a ground line 7. The drain of the PMOS transistor 12 is connected with the source and gate of the NMOS transistor 42a. The drain of the NMOS transistor 42a is connected with the ground line 7.

The current mirror 41 is composed of PMOS transistors 41a and 41b. The sources of the PMOS transistors 41a and 41b are both connected to the power supply line 6. The gates of the PMOS transistors 41a and 41b are connected to each other, and connected to the drain of the PMOS transistor 41a. The drain of the PMOS transistor 41b is connected with the drain of the PMOS transistor 12. Also, the current mirror 43 is composed of PMOS transistors 43a and 43b. The configurations of the current mirror 43 is similar to the configuration of the current mirror 41. The sources of the PMOS transistors 43a and 43b are both connected to the power supply line 6. The gates of the PMOS transistors 43a and 43b are connected to each other, and connected to the drain of the PMOS transistor 43a. The drain of the PMOS transistor 43b is connected with the drain of the PMOS transistor 11.

The drain of the NMOS transistor 21 is connected with the drain of the PMOS transistor 41a and the drain of the NMOS transistor 22 is connected with the drain of the PMOS transistor 43a. The sources of the NMOS transistor 21 and 22 are connected to each other, and connected with the drain of the NMOS transistor 34. The source of the NMOS transistor 34 is connected with the ground line 7. The same input voltage $V_{IN+}$ as supplied to the gate of the PMOS transistor 11 is supplied to the gate of the NMOS transistor 21. The same inverted input voltage $V_{IN-}$ as supplied to the gate of the PMOS transistor 12 is supplied to the gate of the PMOS transistor 22. Any one of the NMOS transistor 21 and the NMOS transistor 22 is turned on in response to the input voltage $V_{IN+}$ and the inverted input voltage $V_{IN-}$.

The bias circuit 3 is composed of PMOS transistors 32 and 33, NMOS transistors 35 and 36 and a CMOS inverter 37. The CMOS inverter 37 is composed of a PMOS transistor 38 and an NMOS transistor 39. The source of the PMOS transistor 32 is supplied with a voltage $V_{BIAS}^{P}$, and the gate of the PMOS transistor 32 is supplied with the control signal Sc. The drain of the PMOS transistor 32 is connected with the gate of the PMOS transistor 31 and the drain of the PMOS transistor 33. The source of the PMOS transistor 33 is connected with the power supply line 6 and the gate thereof is connected with the output of the CMOS inverter 37. The drain of the NMOS transistor 35 is supplied with a voltage $V_{BIAS}^{N}$, and the gate of the NMOS transistor 35 is supplied with the control signal Sc. The source of the NMOS transistor 35 is connected with the gate of the NMOS transistor 34 and the drain of the NMOS transistor 36. The source of the NMOS transistor 36 is connected with the ground line 7 and the gate thereof is connected with the output of the CMOS inverter 37.

The bias circuit 3 selectively activates one of the PMOS transistor pair 1-1 and the NMOS transistor pair 1-2 in response to a control signal $S_C$ supplied externally. When the control signal $S_C$ is pulled down to a "low" voltage (namely, a ground voltage $V_{SS}$), the PMOS transistors 11 and 12 are activated in the differential amplifier circuit 1. On the other hand, when the control signal $S_C$ is pulled up to a "high" voltage (namely, a power supply voltage $V_{DD}$), the NMOS transistors 21 and 22 are activated in the differential amplifier circuit 1. The one of the PMOS transistor pair 1-1 and the NMOS transistor pair 1-2 is activated by the bias circuit 3, and outputs an output current from one of the two MOS transistors included in that transistor pair in response to the input voltage $V_{IN+}$ and the inverted input voltage $V_{IN-}$. In detail, when the PMOS transistor pair 1-1 is activated, the output current is outputted from the drain of the PMOS transistor 12, if the input voltage $V_{IN+}$ is higher than the inverted input voltage $V_{IN-}$. On the Contrary, the output current is outputted from the drain of the PMOS transistor 11, if the input voltage $V_{IN+}$ is lower than the inverted input voltage $V_{IN-}$. When the NMOS transistor pair 1-2 is activated, the output current is outputted from the drain of the NMOS transistor 21, if the input voltage $V_{IN+}$ is higher than the inverted input voltage $V_{IN-}$. On the contrary, the output current is outputted from the drain of the NMOS transistor 22, if the input voltage $V_{IN+}$ is lower than the inverted input voltage $V_{IN-}$.

The output circuit 4 is composed of a current mirror 45, an output inverter 46, and NMOS transistors 42b and 44b. The output inverter 46 is composed of a PMOS transistor 46a and an NMOS transistor 46b. The output of the output inverter 46 functions as an output node. The current mirror 45 is composed of PMOS transistors 45a and 45b. The sources of the PMOS transistors 45a and 45b are connected with the power supply line 6, and the gates thereof are connected to each other and to the drain of the PMOS transistor 45a. The drain of the PMOS transistor 45a is connected with the drain of the NMOS transistor 44b. The gate of the NMOS transistor 44b is connected with the gate of the NMOS transistor 44a and the source thereof is connected with the ground line 7. Thus, the NMOS transistors 44a and 44b form a current mirror 44. The drain of the PMOS transistor 45b is connected with the gates of the PMOS transistor 46a and NMOS transistor 46b as an input of the output inverter and the drain of the NMOS transistor 42b. The gate of the NMOS transistor 42b is connected with the gate of the NMOS transistor 42a and the source thereof is connected with the ground line 7. Thus, the NMOS transistors 42a and 42b form a current mirror 42.

The output circuit 4 generates an output voltage OUT in response to the output from one among the four MOS transistors included in the PMOS transistor pair 1 and the NMOS transistor pair 2. When the output current is outputted from the PMOS transistor 11 or the NMOS transistor 22, the output circuit 4 pulls the output voltage OUT down to the "low" voltage. Also, when the output current is outputted from the PMOS transistor 12 or the NMOS transistor 21, the output circuit 4 pulls the output voltage OUT up to the "high" voltage. That is, if the input voltage $V_{IN+}$ is higher than the inverted input voltage $V_{IN-}$, the output circuit 4 pulls the output voltage OUT up to the "high" voltage, and oppositely, if the input voltage $V_{IN+}$ is lower than the inverted input voltage $V_{IN-}$, the output circuit 4 pulls the output voltage OUT down to the "low" voltage. In this way, the output voltage OUT is outputted based on the fact that the input voltage $V_{IN+}$ is higher or lower than the inverted input voltage $V_{IN-}$. The output voltage OUT is not related to whether either of the PMOS transistor pair 1-1 and the NMOS transistor pair 1-2 is activated.

In the differential amplifier 10 in this embodiment, the range allowed for the input voltage $V_{IN+}$ and the inverted input voltage $V_{IN-}$ can be extended by properly controlling the control signal $S_C$. In the differential amplifier 10, the desired one of the PMOS transistor pair 1-1 and the NMOS transistor pair 1-2 is selectively activated by controlling the control signal $S_C$. Thus, the differential amplifier 10 can generate the output voltage OUT. Moreover, as mentioned above, the allowable ranges of the input voltage $V_{IN+}$ and the inverted input voltage $V_{IN-}$ are different in the PMOS transistor pair 1-1 and the NMOS transistor pair 1-2. Thus, the differential amplifier 10 in this embodiment can generate the output voltage OUT based on the input voltage $V_{IN+}$ and the inverted input voltage $V_{IN-}$ varying in the wide voltage range, namely, the range between the ground voltage $V_{SS}$ and the power supply voltage $V_{DD}$, by selecting the proper one of the PMOS transistor pair 1-1 and the NMOS transistor pair 1-2 in accordance with the control signal $S_C$.

In the differential amplifier 10 in this embodiment, the PMOS transistor pair 1-1 and the NMOS transistor pair 1-2 are exclusively activated, and they are not activated at the same time. Thus, in the differential amplifier 10 in this embodiment, power consumption can be reduced, as compared with the differential amplifier 10 in the conventional example 1 in which both of the PMOS transistor pair and the NMOS transistor pair are always activated.

The differential amplifier 10 will be described below in detail.

The PMOS transistor 31 functions as a constant current source for supplying a constant bias current to the PMOS transistor pair 1-1. The gate of the PMOS transistor 31 is connected through the PMOS transistor 32 to a first bias bus 8 having a bias voltage $V_{BIAS}P$. The bias voltage $V_{BIAS}P$ is predetermined such that the PMOS transistor 31 can supplies a desired bias current to the PMOS transistor pair 1-1. The bias voltage $V_{BIAS}P$ is the voltage between the ground voltage $V_{SS}$ and the power supply voltage $V_{DD}$. The PMOS transistor 32 functions as a switching device for selectively connecting the gate of the PMOS transistor 31 to the first bias bus 8 in response to the control signal $S_C$. The control signal $S_C$ is supplied to the gate of the PMOS transistor 32.

If the control signal $S_C$ is pulled down to the "low" voltage, the PMOS transistor 32 electrically connects the first bias bus 8 to the gate of the PMOS transistor 31, such that it supplies the bias voltage $V_{BIAS}P$ to the gate of the PMOS transistor 31. Thus, the bias current is supplied to the PMOS transistor pair 1-1, and the PMOS transistor pair 1-1 can be activated. On the other hand, if the control signal $S_C$ is pulled up to the "high" voltage, the PMOS transistor 32 electrically disconnects the first bias bus 8 from the gate of the PMOS transistor 31, and the PMOS transistor 31 is turned off. Consequently, the supply of the bias current to the PMOS transistor pair 1-1 is stopped, thereby inactivating the PMOS transistor pair 1-1.

When the PMOS transistor pair 1-1 is inactivated, the PMOS transistor 33 functions as a switching device for electrically connecting the gate of the PMOS transistor 31 to the power supply line 6. An inverted control signal $/S_C$ obtained by inverting the control signal $S_C$ by the CMOS inverter 37 is supplied to the gate of the PMOS transistor 33. If the control signal $S_C$ is pulled up to the "high" voltage, the inverted control signal $/S_C$ is pulled down to the "low" voltage, and the PMOS transistor 33 is turned on. As a result, the gate of the PMOS transistor 31 is electrically connected to the power supply line 6 and fixed to the power supply voltage $V_{DD}$. Consequently, the undesirable bias current is protected from being supplied to the PMOS transistor pair 1-1.

On the other hand, the NMOS transistor 34 functions as a constant current source for supplying a constant bias current to the NMOS transistor pair 1-2. The source of the NMOS transistor 34 is connected to a ground line 7 having the ground voltage $V_{SS}$. The gate of the NMOS transistor 34 is connected through the NMOS transistor 32 to a second bias bus 9 having a bias voltage $V_{BIAS}N$. The bias voltage $V_{BIAS}N$ is predetermined such that the NMOS transistor 34 can supply a desired bias current to the NMOS transistor pair 1-2. The bias voltage $V_{BIAS}N$ is the voltage between the ground voltage $V_{SS}$ and the power supply voltage $V_{DD}$.

The NMOS transistor 35 functions as a switching device for selectively connecting the gate of the NMOS transistor 34 to the second bias bus 9 in response to the control signal $S_C$. The source of the NMOS transistor 35 is connected to the second bias bus 9, and the drain is connected to the gate of the NMOS transistor 34. The control signal $S_C$ is supplied to the gate of the NMOS transistor 35. If the control signal $S_C$ is pulled up to the "high" voltage, the NMOS transistor 35 electrically connects the second bias bus 9 to the gate of the NMOS transistor 34, such that it supplies the bias voltage $V_{BIAS}N$ to the gate of the NMOS transistor 34. At this time, the bias current is supplied to the NMOS transistor pair 1-2, and the NMOS transistor pair 1-2 is activated. On the other hand, if the control signal $S_C$ is pulled down to the "low" voltage, the NMOS transistor 35 electrically disconnects the second bias bus 9 from the gate of the NMOS transistor 34, and the NMOS transistor 34 is turned off. Consequently, the supply of the bias current to the NMOS transistor pair 1-2 is stopped, thereby inactivating the NMOS transistor pair 1-2.

When the NMOS transistor pair 1-2 is inactivated, the NMOS transistor 36 functions as a switching device for electrically connecting the gate of the NMOS transistor 34 to the ground line 7. The inverted control signal $/S_C$ generated by the CMOS inverter 37 is supplied to the gate of the NMOS transistor 36. If the control signal $S_C$ is pulled down to the "low" voltage, the inverted control signal $/S_C$ is pulled up to the "high" voltage, and the NMOS transistor 36 is turned on. At this time, the gate of the NMOS transistor 34 is electrically connected to the ground line 7 and fixed to the ground voltage $V_{SS}$. Consequently, the undesirable bias current is protected from being supplied to the NMOS transistor pair 1-2.

The above-mentioned structure in which the PMOS transistor 32 and the NMOS transistor 35 are driven by the control signal $S_C$ and the PMOS transistor 33 and the NMOS transistor 36 are driven by the inverted control signal /$S_C$ is preferable in that the number of the elements required to configure the bias circuit 3 is small.

In the NMOS transistor and the PMOS transistor, typically, a certain degree of voltage drop is between its gate and source (the voltage between the gate and the source). When the NMOS transistor and the PMOS transistor are used as a transfer gate, the voltages of the source and the drain may become unequal due to the voltage drop between the gate and the source. In such a case, it is desirable that a set of NMOS transistors and a set of PMOS transistors in which the sources and the drains are coupled to each other are used for the transfer gate.

However, as described, in this embodiment, the PMOS transistor 32 is driven by the control signal $S_C$ and the PMOS transistor 33 is driven by the inverted control signal /$S_C$. Therefore, the transfer gate with the above structure needs not to be used. Thus, the number of elements required for the bias circuit 3 is effectively reduced. Similarly, the NMOS transistor 35 is driven by the control signal $S_C$ and the NMOS transistor 36 is driven by the inverted control signal /$S_C$. Therefore, the transfer gate with the above structure needs not to be used. Thus, the number of elements required for the bias circuit 3 is effectively reduced.

On the other hand, the output circuit 4 includes the current mirror 45 and the output inverter 46, as mentioned above. The output inverter 46 inverts a voltage of the input node 47 and outputs to the output node 48. The voltage of the output node 48 is the output voltage OUT of the differential amplifier 10.

The PMOS transistor 41b of the current mirror 41 supplies a current to the current mirror 42 only when the current flows through the NMOS transistor 21. The current corresponding to the current flowing through the NMOS transistor 21 is outputted from the drain of the PMOS transistor 41b of the current mirror 41. Thus, the current is supplied to the current mirror 42, if the current flows through the PMOS transistor 12 or the NMOS transistor 21, namely, if the input voltage $V_{IN+}$ is higher than the inverted input voltage $V_{IN-}$. Whether or not the current is supplied to the current mirror 42 is not related to whether the PMOS transistor pair 1-1 or the NMOS transistor pair 1-2 is activated. If the current is supplied to the current mirror 42, namely, if the input voltage $V_{IN+}$ is higher than the inverted input voltage $V_{IN-}$, the NMOS transistor 42b of the current mirror 42 functions as a constant current source. On the contrary, if the input voltage $V_{IN+}$ is lower than the inverted input voltage $V_{IN-}$, the NMOS transistor 42b is turned off, and the input node 47 and the ground line 7 are electrically disconnected.

On the other hand, a current is supplied from the current mirror 43 to the current mirror 44 only when the current flows through the NMOS transistor 22. The current corresponding to the current flowing through the NMOS transistor 22 is outputted from the drain of the PMOS transistor 43b of the current mirror 43. Thus, the current is supplied to the current mirror 44, if the current flows through the PMOS transistor 11 or the NMOS transistor 22, namely, if the input voltage $V_{IN+}$ is lower than the inverted input voltage $V_{IN-}$. Whether or not the current is supplied to the current mirror 44 is not related to whether the PMOS transistor pair 1-1 or the NMOS transistor pair 1-2 is activated. If the current is supplied to the current mirror 44, namely, if the input voltage $V_{IN+}$ is lower than the inverted input voltage $V_{IN-}$, the NMOS transistor 44b of the current mirror 44 functions as a constant current source. On the other hand, if the input voltage $V_{IN+}$ is higher than the inverted input voltage $V_{IN-}$, the NMOS transistor 44b is turned off.

The drain of the PMOS transistor 45a of the current mirror 45 is connected to the drain of the NMOS transistor 44b of the current mirror 44. If the NMOS transistor 44b functions as the constant current source and makes the current flow into the PMOS transistor 45a of the current mirror 45, namely, if the input voltage $V_{IN+}$ is lower than the inverted input voltage $V_{IN-}$, the PMOS transistor 45b of the current mirror 45 functions as the constant current source. On the other hand, if the input voltage $V_{IN+}$ is higher than the inverted input voltage $V_{IN-}$, the PMOS transistor 45b is turned off.

The drain of the NMOS transistor 42b of the current mirror 42 and the drain of the PMOS transistor 45b of the current mirror 45 are connected to the input node 47. The voltage of the input node 47 is determined in accordance with the input voltage $V_{IN+}$ and the inverted input voltage $V_{IN-}$. As mentioned above, if the input voltage $V_{IN+}$ is higher than the inverted input voltage $V_{IN-}$, the NMOS transistor 42a functions as a current source. On the other hand, the PMOS transistor 45b is turned off. Thus, the input node 47 is pulled down to the "low" voltage. On the other hand, if the input voltage $V_{IN+}$ is lower than the inverted input voltage $V_{IN-}$, the NMOS transistor 42b is turned off. On the other hand, the PMOS transistor 45b functions as a constant current source. Hence, the input node 47 is pulled up to the "high" voltage.

As mentioned above, the output inverter 47 inverts the voltage of the input node 47 and outputs the output voltage OUT. Thus, if the input voltage $V_{IN+}$ is higher than the inverted input voltage $V_{IN-}$, the output voltage OUT is pulled up to the "high" voltage. On the contrary, if the input voltage $V_{IN+}$ is lower than the inverted input voltage $V_{IN-}$, the output voltage OUT is pulled down to the "low" voltage.

Next, the operation of the differential amplifier 10 in this embodiment will be described. Before the differential amplifier 10 is operated, the control signal $S_C$ corresponding to the range of the input voltage $V_{IN+}$ and inverted input voltage $V_{IN-}$ to be supplied is supplied from the external unit, and one of the PMOS transistor pair 1-1 and the NMOS transistor pair 1-2 is activated. The control signal $S_C$ is supplied from a pad of the LSI containing the differential amplifier 10.

If the input voltage $V_{IN+}$ and the inverted input voltage $V_{IN-}$ are near to the ground voltage $V_{SS}$, the control signal $S_C$ is set to the "low" voltage, and the PMOS transistor pair 1-1 is activated. If the control signal $S_C$ is set to the "low" voltage, the PMOS transistor 32 is turned on, and the bias voltage $V_{BIAS}P$ is supplied to the PMOS transistor 31. At this time, the PMOS transistor 31 supplies the bias current to the PMOS transistor pair 1-1 and activates the PMOS transistor pair 1-1. Also, in response to the inverted control signal /$S_C$ set in the "High" voltage, the NMOS transistor 36 is turned on, and the gate of the NMOS transistor 34 is connected to the ground line 7. Consequently, the gate of the NMOS transistor 34 is fixed to the ground voltage $V_{SS}$. Thus, the NMOS transistor pair 1-2 is protected from being undesirably operated.

On the other hand, if the input voltage $V_{IN+}$ and the inverted input voltage $V_{IN-}$ are near to the power supply voltage $V_{DD}$, the control signal $S_C$ is set to the "high" voltage, and the NMOS transistor pair 1-2 is activated. At this time, the NMOS transistor 35 is turned on, and the bias voltage $V_{BIAS}N$ is supplied to the NMOS transistor 34. As a result, the NMOS transistor 34 supplies the bias current to the NMOS transistor pair 1-2 and activates the NMOS transistor pair 1-2. Also, in response to the inverted control signal $/S_C$ set to the "low" voltage, the PMOS transistor 33 is turned on, and the gate of the PMOS transistor 31 is connected to the power supply line 6. Consequently, the gate of the PMOS transistor 31 is fixed to the power supply voltage $V_{DD}$. Thus, the PMOS transistor pair 1-1 is protected from being undesirably operated.

In this way, only one of the PMOS transistor pair 1-1 and the NMOS transistor pair 1-2 is activated, thereby reducing the power consumption of the differential amplifier 10.

After the control signal $S_C$ is set, the input voltage $V_{IN+}$ and the inverted input voltage $V_{IN-}$ are supplied, and the output voltage OUT is outputted from the output circuit 4, in accordance with whether the input voltage $V_{IN+}$ or the inverted input voltage $V_{IN-}$ is higher. If the input voltage $V_{IN+}$ is higher than the inverted input voltage $V_{IN-}$, the output voltage OUT is pulled up to the "high" voltage. If the input voltage $V_{IN+}$ is lower than the inverted input voltage $V_{IN-}$, the output voltage OUT is pulled down to the "low" voltage.

The output voltage OUT does not depend on whether the PMOS transistor pair 1-1 or the NMOS transistor pair 1-2 is activated. For example, it is supposed that the input voltage $V_{IN+}$ is higher than the inverted input voltage $V_{IN-}$. If the PMOS transistor pair 1-1 is activated, the current flows through the PMOS transistor 12 of the PMOS transistor pair 1-1, the current flows through the current mirror 42 from the PMOS transistor 12, and the NMOS transistor 42b of the current mirror 42 is turned on. Thus, the input node 47 is pulled down to the "low" voltage. Finally, the output voltage OUT outputted by the output inverter 46 is pulled up to the "high" voltage. On the other hand, if the NMOS transistor pair 1-1 is activated, the current flows through the NMOS transistor 21 of the NMOS transistor pair 1-1, and the current flows through the current mirror 42 from the current mirror 41 connected to the NMOS transistor 21, and the NMOS transistor 42b of the current mirror 42 is turned on. Hence, similarly to the case that the PMOS transistor pair 1-1 is activated, the input node 47 is pulled down to the "low" voltage. Finally, the output voltage OUT is pulled up to the "High" voltage.

As understood from the above, even if any one of the PMOS transistor pair 1-1 and the NMOS transistor pair 1-2 is activated, the desirable output voltage OUT is outputted from the output inverter 46.

The differential amplifier 10 can operate even if the common mode component of the input voltage $V_{IN+}$ and the inverted input voltage $V_{IN-}$, namely, the common mode voltage $V_{CM}$ takes any value between the ground voltage $V_{SS}$ and the power supply voltage $V_{DD}$. FIG. 4 is graphs showing the dependence of the delay time of the differential amplifier 10 on the common mode voltage $V_{CM}$. The power supply voltage $V_{DD}$ is 2.3 V. When the PMOS transistor pair 1-1 is activated, the differential amplifier 10 can normally operate if the common mode voltage $V_{CM}$ is 1.3 V or below. On the other hand, when the NMOS transistor pair 1-2 is activated, the differential amplifier 10 can normally operate if the common mode voltage $V_{CM}$ is 0.9 V or above. In this way, if one of the PMOS transistor pair 1-1 and the NMOS transistor pair 1-2 is properly activated, the differential amplifier 10 can operate in the input voltage range between 0 V and the power supply voltage.

As mentioned above, in the differential amplifier 10 in this embodiment, it is possible to reduce the power consumption while extending the allowable range for the input voltage $V_{IN+}$ and the inverted input voltage $V_{IN-}$.

(Second Embodiment)

FIG. 5 shows the differential amplifier according to the second embodiment of the present invention. In the differential amplifier 10 of the second embodiment, a control signal generation circuit 5 for generating the control signal $S_C$ based on the input voltage $V_{IN+}$ and the inverted input voltage $V_{IN-}$ is added to the circuit structure of the differential amplifier 10 in the first embodiment.

Figure 6:
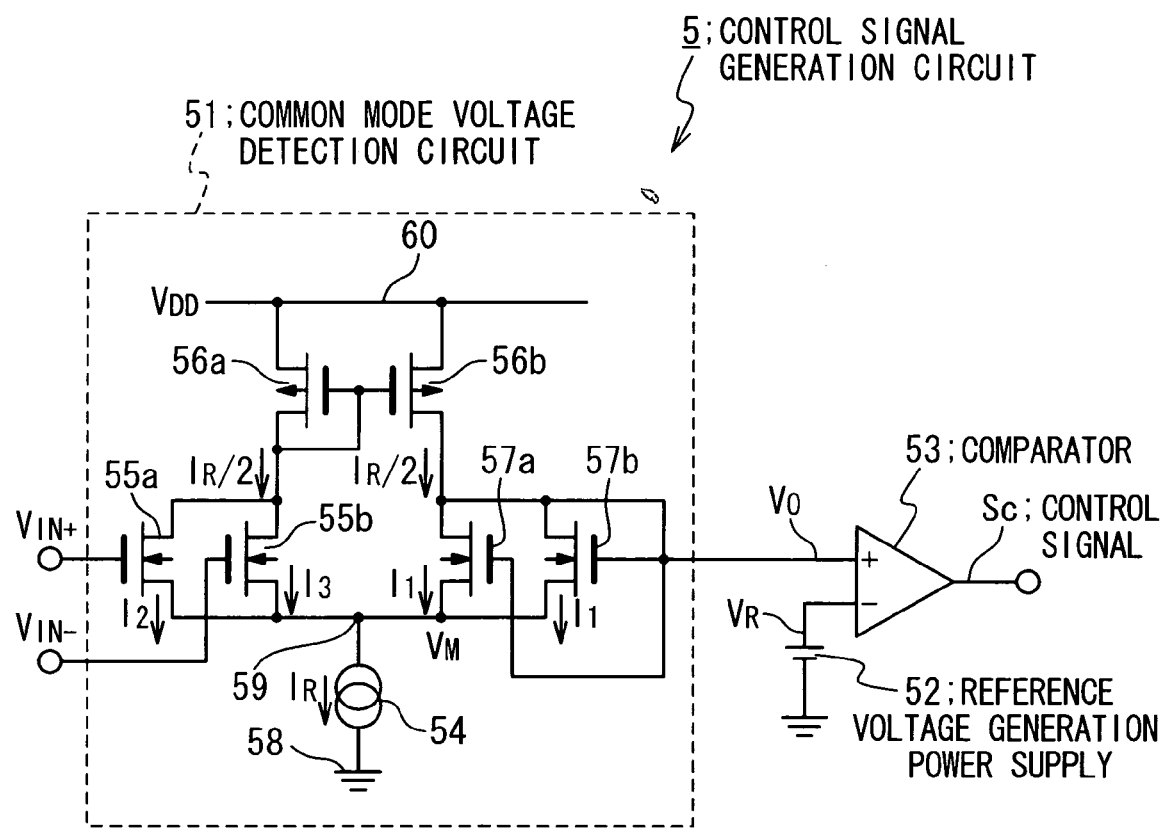
FIG. 6 is a circuit diagram showing a control signal generation circuit included in the differential amplifier in the second embodiment.

As shown in FIG. 6, the control signal generation circuit 5 is composed of a common mode voltage detection circuit 51, a reference voltage generation power supply 52 and a comparator 53. The common mode voltage detection circuit 51 generates an output voltage $V_O$ substantially equal to the common mode voltage $V_{CM}$ in response to the input voltage $V_{IN+}$ and the inverted input voltage $V_{IN-}$. The reference voltage generation power supply 52 generates a reference voltage $V_R$. The reference voltage $V_R$ is a voltage between the ground voltage $V_{SS}$ and the power supply voltage $V_{DD}$, and is preferably $V_{DD}/2$. The comparator 53 compares the output voltage $V_O$ with the reference voltage $V_R$ and outputs the control signal $S_C$. If the output voltage $V_O$ is higher than the reference voltage $V_R$, the comparator 53 pulls the control signal $S_C$ up to the "high" voltage. If it is lower, the comparator 53 pulls the control signal $S_C$ down to the "low" voltage. Thus, if the input voltage $V_{IN+}$ and the inverted input voltage $V_{IN-}$ are relatively low, the PMOS transistor pair 1-1 is activated. If the input voltage $V_{IN+}$ and the inverted input voltage $V_{IN-}$ are relatively high, the NMOS transistor pair 1-2 is activated. Consequently, the transistor pair suitably selected on the basis of the input voltage $V_{IN+}$ and the inverted input voltage $V_{IN-}$ is activated.

The common mode voltage detection circuit 51 is composed of a constant current source 54 for generating a current $I_R$, NMOS transistors 55a, 55b, PMOS transistors 56a, 56b and NMOS transistors 57a, 57b. In the constant current source 54, one end thereof is connected to a ground terminal 58, and the current $I_R$ flows into the ground terminal 58. The other end of the constant current source 54 is connected through a node 59 to the sources of the NMOS transistors 55a and 55b. The input voltage $V_{IN+}$ and the inverted input voltage $V_{IN-}$ are supplied to the gates of the NMOS transistors 55a and 55b, respectively. The drains of the NMOS transistors 55a and 55b are connected to drains of the PMOS transistor 56a. The PMOS transistor 56a together with the PMOS transistor 56b constitutes a current mirror. The characteristics of the PMOS transistors 56a and 56b are same. The sources of the PMOS transistors 56a and 56b are connected to a power supply line 60 having the power supply voltage $V_{DD}$. The gates of the PMOS transistors 56a and 56b are connected to each other and connected to the drain of the PMOS transistor 56a. The drain of the PMOS transistor 56b is connected to the drains of the NMOS transistors 57a and 57b. The sources of the NMOS transistors 57a and 57b are connected through the node 59 to the constant current source 54. The drains of the NMOS transistors 57a and 57b are connected to their gates, so that the drains and gates of the NMOS transistors 57a and 57b can be kept at the same voltage. The voltages of the gates of the NMOS transistors 57a and 57b are the output voltage $V_O$ of the common mode voltage detection circuit 51. The characteristics of the NMOS transistors 57a and 57b are substantially the same as those of the NMOS transistors 55a and 55b.

The output voltage $V_O$ of the common mode voltage detection circuit 51 is approximately coincident with the average between the input voltage $V_{IN+}$ and the inverted input voltage $V_{IN-}$, namely, the common mode voltage $V_{CM}$.

The NMOS transistors 55a and 55b supply currents I₂ and I₃ respectively corresponding to the input voltage $V_{IN+}$ and the inverted input voltage $V_{IN-}$ to the node 59. The current $I_R/2$ having the value equal to the sum of the current I₂ and the current I₃ flows through the PMOS transistor 56a. The PMOS transistors 56a and 56b form the current mirror. Thus, the current $I_R/2$ equal to the current flowing through the PMOS transistor 56a flows into the drains of the NMOS transistors 57a and 57b. Since the NMOS transistors 57a, 57b have the same characteristics, the currents I₁ having the same value flow through the NMOS transistors 57a and 57b. The sum of the currents flowing through the NMOS transistors 57a and 57b is coincident with the sum of the currents flowing through the NMOS transistors 55a and 55b. Thus, the current I₁ is coincident with the average of the currents I₂ and I₃. Moreover, the characteristics of the NMOS transistors 57a and 57b are coincident with those of the NMOS transistors 55a and 55b. Thus, the voltages of the gates of the NMOS transistors 57a and 57b become approximately the average voltage between the input voltage $V_{IN+}$ and the inverted input voltage $V_{IN-}$, namely, the common mode voltage $V_{CM}$.

More strictly, the output voltage $V_O$ of the common mode voltage detection circuit 51 is represented by the following equation:

$$V_o = \frac{V_{IN+} + V_{IN-}}{2} + \frac{2\sqrt{\frac{2I_1}{\beta}} - \sqrt{\left(2\sqrt{\frac{2I_1}{\beta}}\right)^2 - (V_{IN+} - V_{IN-})^2}}{2} \quad (1)$$

where I₁ is the current flowing through the NMOS transistors 57a or 57b, and β is a value represented by the following equation by using a gate width W, a gate length L, a mobility μ and a gate capacitance $C_o$:

$$\beta = \frac{W}{L}\mu C_o \quad (2)$$

The first item of the equation (1) is the average between the input voltage $V_{IN+}$ and the inverted input voltage $V_{IN-}$, namely, the common mode voltage $V_{CM}$. The second item of the equation (1) is an error from the common mode voltage $V_{CM}$ that is caused by a non-linear property of the MOS transistor. The value of the second item is small.

As shown in the equation (1), the output voltage $V_O$ is not strictly coincident with the common mode voltage $V_{CM}$. However, the output voltage $V_O$ is at least between the input voltage $V_{IN+}$ and the inverted input voltage $V_{IN-}$. Thus, the output voltage $V_O$ functions as an index to determine the voltage range between the input voltage $V_{IN+}$ and the inverted input voltage $V_{IN-}$.

In the differential amplifier 10 in this embodiment, the output voltage $V_O$ substantially coincident with the common mode voltage $V_{CM}$ is generated from the input voltage $V_{IN+}$ and the inverted input voltage $V_{IN-}$. Then, the control signal $S_C$ is generated based on the output voltage $V_o$. Consequently, the control signal $S_C$ is generated in accordance with to the voltage range between the input voltage $V_{IN+}$ and the inverted input voltage $V_{IN-}$. Then, the suitable one of the PMOS transistor pair 1-1 and the NMOS transistor pair 1-2 is automatically selected and activated.

In the second embodiment, if the common mode voltage detection circuit 51 requires a large driving capability, a buffer 61 is preferably inserted between the drains and gates of the NMOS transistors 57a and 57b, as shown in FIG. 6. An input of the buffer 61 is connected to the drains of the NMOS transistors 57a and 57b, and an output is connected to the gates of the NMOS transistors 57a and 57b, namely, an output terminal from which the output voltage $V_O$ is outputted.

Figure 7:
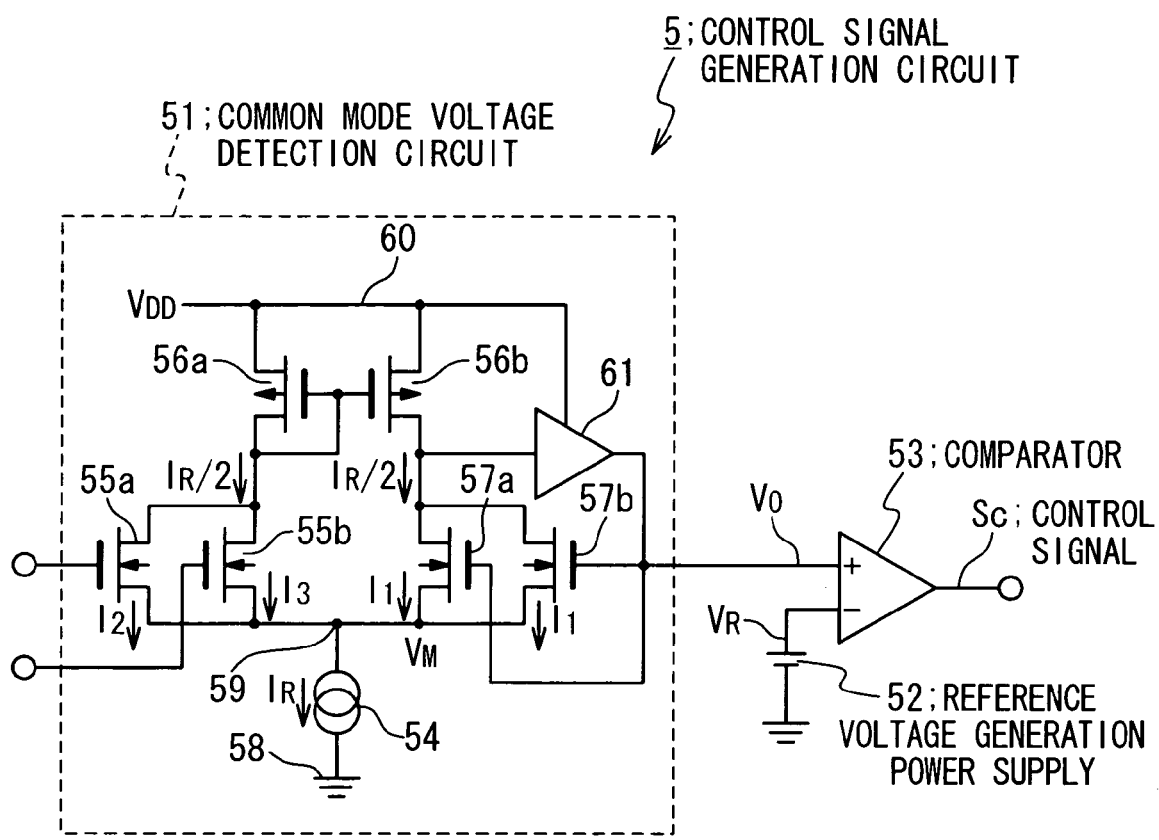
FIG. 7 is a circuit diagram showing a modification of the control signal generation circuit included in the differential amplifier in the second embodiment.
Figure 8:
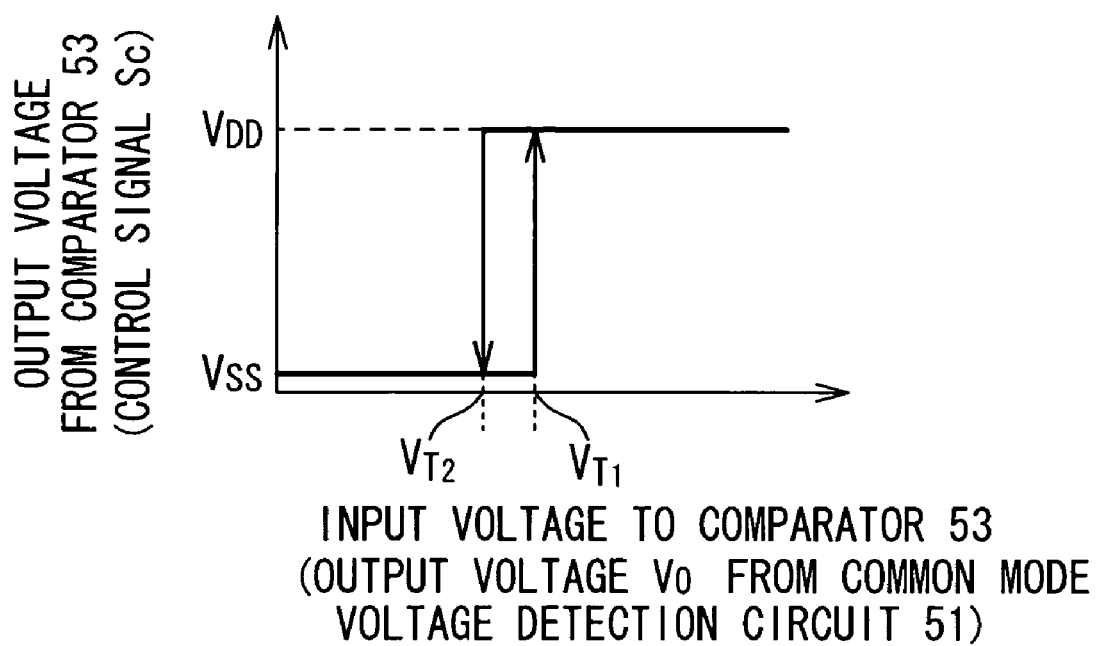
FIG. 8 is a waveform diagram showing a desired input output characteristic of a comparator included in the differential amplifier in the second embodiment.

Noise may be induced in the output voltage $V_O$ of the common mode voltage detection circuit 51 shown in FIGS. 6 and 7. In order to prevent an erroneous operation due to the noise, the comparator 53 preferably has a hysteresis property, as shown in FIG. 8. That is, the comparator 53 is configured such that if the input voltage of the comparator 53, namely, the output voltage $V_O$ of the common mode voltage detection circuit 51 is increased, the voltage of the control signal $S_C$ is shifted from the "low" voltage to the "high" voltage when the input voltage of the comparator 53 exceeds a threshold $V_{T1}$. Moreover, the comparator 53 is configured such that if the input voltage of the comparator 53 is decreased, the voltage of the control signal $S_C$ is shifted from the "low" voltage to the "high" voltage when the input voltage of the comparator 53 becomes less than a threshold $V_{T2}$ (<$V_{T1}$). Consequently, even if the noise causes the output voltage $V_O$ to be fluctuated, the control signal $S_C$ is protected from being unstable because of that fluctuation.

Figure 9:
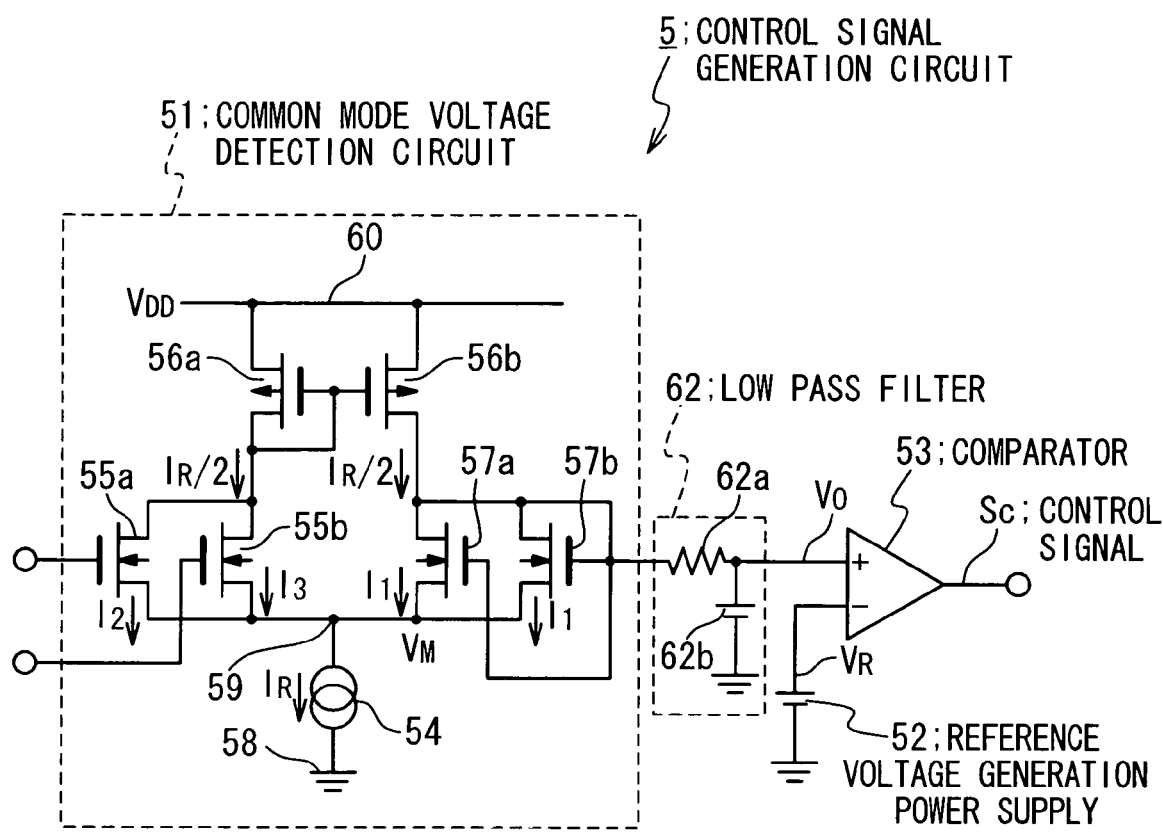
FIG. 9 is a circuit diagram showing another modification of the control signal generation circuit included in the differential amplifier in the second embodiment.

As another means for protecting the erroneous operation due to the noise, a low pass filter 62 can be inserted between the comparator 53 and the common mode voltage detection circuit 51, as shown in FIG. 9. The low pass filter 62 is typically composed of a resistor 62a and a capacitor 62b. One terminal of the resistor 62a is connected to an output terminal of the common mode voltage detection circuit 51, and the other terminal of the resistor 62a is connected to an input terminal of the comparator 53. The capacitor 62b is put between the other terminal of the resistor 62 and a ground terminal 63 having the ground voltage $V_{SS}$. Consequently, the output voltage $V_O$ from which the noise of high frequency is removed is supplied to the comparator 53, which protects the control signal $S_C$ from being unstable.

The circuits shown in FIGS. 6, 7 and 9 are only examples. In actual, one of the NMOS circuits shown in FIGS. 6, 7 and 9 and a PMOS circuit, in which NMOS transistors and PMOS transistors are exchanged in FIGS. 6, 7 and 9, need to be connected in parallel.

According to the present invention, the differential amplifier is provided in which the allowable range for the input voltage is wide and its power consumption is small.

What is claimed is:

1. A differential amplifier comprising:
   a differential amplifier circuit comprising first and second differential amplifier sections;
   wherein said first differential amplifier section comprises:
   a first differential pair of PMOS transistors which receives first and second input voltages, respectively;
   wherein said second differential amplifier section comprises:
   a second differential pair of NMOS transistors which receive said first and second input voltages, respectively;
   a bias circuit which only activates only one of said first and second differential amplifier sections in response to a control signal; and
   an output circuit which outputs an output signal from an output of said activated differential amplifier section, wherein said first and second differential amplifier sections comprise a first PMOS transistor and a first NMOS transistor function as constant current sources, respectively,
said bias circuit stops an operation of said first PMOS transistor when activating said second differential amplifier section, and stops an operation of said first NMOS transistor when activating said first differential amplifier section.

2. The differential amplifier according to claim 1, wherein said bias circuit comprises:
a first switch arranged to connect a first bias voltage to a gate of said first PMOS transistor in response to said control signal; and
a second switch arranged to connect a second bias voltage to a gate of said first NMOS transistor in response to said control signal, and
when one of said first and second switches is turned on, the other is turned off.

3. The differential amplifier according to claim 2, wherein said bias circuit comprises:
an inverter which inverts said control signal;
a third switch which is connected between said power supply line and the gate of said first PMOS transistor and switches in response to the inverted control signal; and
a fourth switch which is connected between said ground line and the gate of said first NMOS transistor and switches in response to the inverted control signal,
when one of said third and fourth switches is turned on, the other is turned off.

4. The differential amplifier according to claim 3, wherein when said first switch is turned on, said third switch is turned off, and when said second switch is turned on, said fourth switch is turned off.

5. A differential amplifier comprising:
a differential amplifier circuit comprising first and second differential amplifier sections;
wherein said first differential amplifier section comprises:
a first differential pair of PMOS transistors which receives first and second input voltages, respectively;
wherein said second differential amplifier section comprises:
a second differential pair of NMOS transistors which receive said first and second input voltages, respectively;
a bias circuit which only activates only one of said first and second differential amplifier sections in response to a control signal; and
an output circuit which outputs an output signal from an output of said activated differential amplifier section,
wherein said first differential amplifier section comprises:
a first current mirror circuit whose input is connected with an output from one of said PMOS transistors of said first differential pair; and
a second current mirror circuit whose input is connected with an output from the other of said PMOS transistors of said first differential pair,
said second differential amplifier section comprises:
a third current mirror circuit, one of whose outputs is connected with one of said NMOS transistors of said second differential pair; and
a fourth current mirror circuit, one of whose outputs is connected with the other of said NMOS transistors of said second differential pair.

6. The differential amplifier according to claim 5, wherein the other output of said third current mirror circuit is connected with the input of said second current mirror circuit, and
the other output of said fourth current mirror circuit is connected with the input of said first current mirror circuit.

7. A The differential amplifier according to claim 6, wherein said output circuit obtains the output of said activated differential amplifier section from said third and fourth current mirror circuits.

8. A differential amplifier comprising:
a differential amplifier circuit comprising first and second differential amplifier sections;
wherein said first differential amplifier section comprises:
a first differential pair of PMOS transistors which receives first and second input voltages, respectively;
wherein said second differential amplifier section comprises:
a second differential pair of NMOS transistors which receive said first and second input voltages, respectively;
a bias circuit which only activates only one of said first and second differential amplifier sections in response to a control signal; and
an output circuit which outputs an output signal from an output of said activated differential amplifier section, and further comprising:
a control signal generating circuit which generates said control signal based on said first and second input voltages.

9. The differential amplifier according to claim 8, wherein said control signal generating circuit comprises:
a first circuit which generates an average voltage of said first and second input voltages; and
a second circuit which generates said control signal from said average voltage.

10. The differential amplifier according to claim 9, wherein said first circuit comprises:
a second constant current source connected with said ground line;
third NMOS transistors which are connected with said second constant current source and receives said first and second input voltages at gates of said third NMOS transistors;
fourth NMOS transistors which are connected with said second constant current source; and
a current mirror which is connected with said power supply line arid supplies said fourth NMOS transistor with a current equal to a sum of currents flowing through said third NMOS transistors, and
said average voltage is outputted from a node between said current mirror and said fourth NMOS transistors.

11. The differential amplifier according to claim 10, wherein said second circuit comprises:
a comparator which compares a predetermined reference voltage and said average voltage to output said control signal.

12. The differential amplifier according to claim 10, wherein said control signal generating circuit further comprises:
a filter circuit which is provided between said first and second circuits.

13. The differential amplifier according to claim 10, wherein said first circuit further comprises:
a buffer which is connected between said node and said second circuit.

14. A method of outputting an output signal from first and second input voltages in an differential amplifier circuit comprising first and second differential amplifier sections, wherein said first differential amplifier section comprises a first differential pair of PMOS transistors which respectively receives first and second input voltages, and wherein said second differential amplifier section comprises a second differential pair of NMOS transistors which respectively receives said first and second input voltages, said method comprising:

activating only one of said first and second differential amplifier sections in response to a control signal;

supplying first and second input voltages to said activated differential amplifier section; and outputting an output signal from an output of said activated differential amplifier section, wherein said activating comprises:

(a) controlling a first constant current source for said first differential amplifier section to be tuned on and a second constant current source for said second differential amplifier section to be turned off when said first differential amplifier section is activated in response to said control signal; and (b) controlling said second constant current source to be turned on and said first constant current source to be turned off when said second differential amplifier section is activated in response to said control signal.

15. The method according to claim 14, wherein said (a) controlling comprises:

supplying a first bias voltage to a gate of a first PMOS transistor of said first constant current source; and stopping the supply of said first bias voltage to the gate of said first PMOS transistor.

16. The method according to claim 14, wherein said (b) controlling comprises:

supplying a second bias voltage to a gate of a first NMOS transistor of said second constant current source; and stopping the supply of said second bias voltage to the gate of said first NMOS transistor.

17. The method according to claim wherein said activating comprises:

inverting said control signal;

stopping an operation of said second constant current source in response to the inverted control signal, when said first differential amplifier section is activated in response to said control signal; and stopping an operation of said first constant current source in response to the inverted control signal, when said second differential amplifier section is activated in response to said control signal.

18. A method of outputting an output signal from first and second input voltages in an differential amplifier circuit comprising first and second differential amplifier sections, wherein said first differential amplifier section comprises a first differential pair of PMOS transistors which respectively receives first and second input voltages, and wherein said second differential amplifier section comprises a second differential pair of NMOS transistors which respectively receives said first and second input voltages, said method comprising:

activating only one of said first and second differential amplifier sections in response to a control signal;

supplying first and second input voltages to said activated differential amplifier section;

outputting an output signal from an output of said activated differential amplifier section; and generating said control signal based on said first and second input voltages.

19. A differential amplifier comprising:

a differential amplifier circuit comprising first and second differential amplifier sections;

wherein said first differential amplifier section comprises:

a first differential pair of PMOS transistors which receives first and second input voltages, respectively;

wherein said second differential amplifier section comprises:

a second differential pair of NMOS transistors which receive said first and second input voltages, respectively;

a bias circuit which only activates only one of said first and second differential amplifier sections in response to a control signal; and an output circuit which outputs an output signal from an output of said activated differential amplifier section, and further comprising:

a first input voltage terminal; and a second input voltage terminal, wherein, said first differential pair of PMOS transistors have gates respectively connected to the first and second input voltage terminals, and said second differential pair of NMOS transistors have gates respectively connected to the first and second input voltage terminals, said first and second differential amplifier sections comprise a first PMOS transistor and a first NMOS transistor connected as constant current sources respectively to the first and second differential pair transistors, respectively, and said bias circuit stops an operation of said first PMOS transistor when activating said second differential amplifier section, and stops an operation of said first NMOS transistor when activating said first differential amplifier section.

20. The differential amplifier according to claim 1, wherein only said first differential amplifier section is activated for a first predetermined time period and only said second differential amplifier section is activated for a second predetermined time period of time period different than the first predetermined time period.

21. A differential amplifier comprising:

a differential amplifier circuit comprising first and second differential amplifier sections;

wherein said first differential amplifier section comprises:

a first differential pair of PMOS transistors which receives first and second input voltages, respectively;

wherein said second differential amplifier section comprises:

a second differential pair of NMOS transistors which receive said first and second input voltages, respectively;

a bias circuit which only activates only one of said first and second differential amplifier sections in response to a control signal; and an output circuit which outputs an output signal from an output of said activated differential amplifier section, wherein only said first differential amplifier section is activated when a voltage level of a predetermined signal is closer to a higher power supply voltage and only said second differential amplifier section is activated when the voltage level of the predetermined signal is closer to a lower power supply voltage.

22. The differential amplifier according to claim 5, wherein only said first differential amplifier section is activated for a first predetermined time period and only said second differential amplifier section is activated for a second predetermined time period of time period different than the first predetermined time period.

23. The differential amplifier according to claim 8, wherein only said first differential amplifier section is activated for a first predetermined time period and only said second differential amplifier section is activated for a second predetermined time period of time period different than the first predetermined time period.

* * * * *